US006953898B2

United States Patent
Chen et al.

(10) Patent No.: US 6,953,898 B2
(45) Date of Patent: Oct. 11, 2005

(54) ANTI-ABRASIVE MECHANISM CONFINING FLAT FLEXIBLE CABLE IN POSITION IN FLATBED IMAGE SCANNER

(75) Inventors: Hsi-Yu Chen, Taipei (TW); Yi-Yung Tsai, Changhua (TW); Chien-Kuo Kuan, Taipei (TW)

(73) Assignee: Primax Electronics, LTD (TW)

( * ) Notice: Subject to any disclaimer, the term of this patent is extended or adjusted under 35 U.S.C. 154(b) by 50 days.

(21) Appl. No.: 10/791,135

(22) Filed: Mar. 2, 2004

(65) Prior Publication Data

US 2004/0182594 A1 Sep. 23, 2004

(30) Foreign Application Priority Data

Mar. 5, 2003 (TW) ........................................ 92104722 A
Apr. 29, 2003 (TW) ........................................ 92110079 A (51) Int. Cl.⁷ .............................................. A63B 21/06
(52) U.S. Cl. .................... 174/99 R; 174/100; 174/72 A
(58) Field of Search ............................... 174/100, 72 A, 174/99 R (56) References Cited

U.S. PATENT DOCUMENTS 5,791,853 A * 8/1998 Danielson et al. .......... 414/280

6,323,428 B1    11/2001  Takano
2001/0040705 A1 * 11/2001  Yokota ........................ 358/474

FOREIGN PATENT DOCUMENTS

CN          2393159 Y      8/2000

* cited by examiner

*Primary Examiner*—Dean A. Reichard
*Assistant Examiner*—Jinhee Lee
(74) *Attorney, Agent, or Firm*—Madson & Metcalf (57) ABSTRACT

A mechanism for confining a flat flexible cable of an image scanner in position is provided. The flat flexible cable is electrically connected between a circuit board and a carriage and bends differentially with the movement of the carriage relative to the circuit board under a scanning platform. The mechanism includes a confining member disposed between a first portion of the flat flexible cable and the scanning platform for isolating the flat flexible cable from the scanning platform. The confining member changes states and bends differentially with the movement of the carriage relative to the circuit board under the scanning platform, and has a bending resistance greater than that of the flat flexible cable. Accordingly, the confining member is kept at least a certain clearance from the scanning platform while confining the first portion of the flat flexible cable thereunder.

6 Claims, 13 Drawing Sheets

ANTI-ABRASIVE MECHANISM CONFINING FLAT FLEXIBLE CABLE IN POSITION IN FLATBED IMAGE SCANNER

FIELD OF THE INVENTION

The present invention relates to an anti-abrasive mechanism for use in a flatbed image scanner, and more particularly to a mechanism for avoiding abrasion by confining the flat flexible cable in position in the flatbed image scanner.

BACKGROUND OF THE INVENTION

Figure 1A:
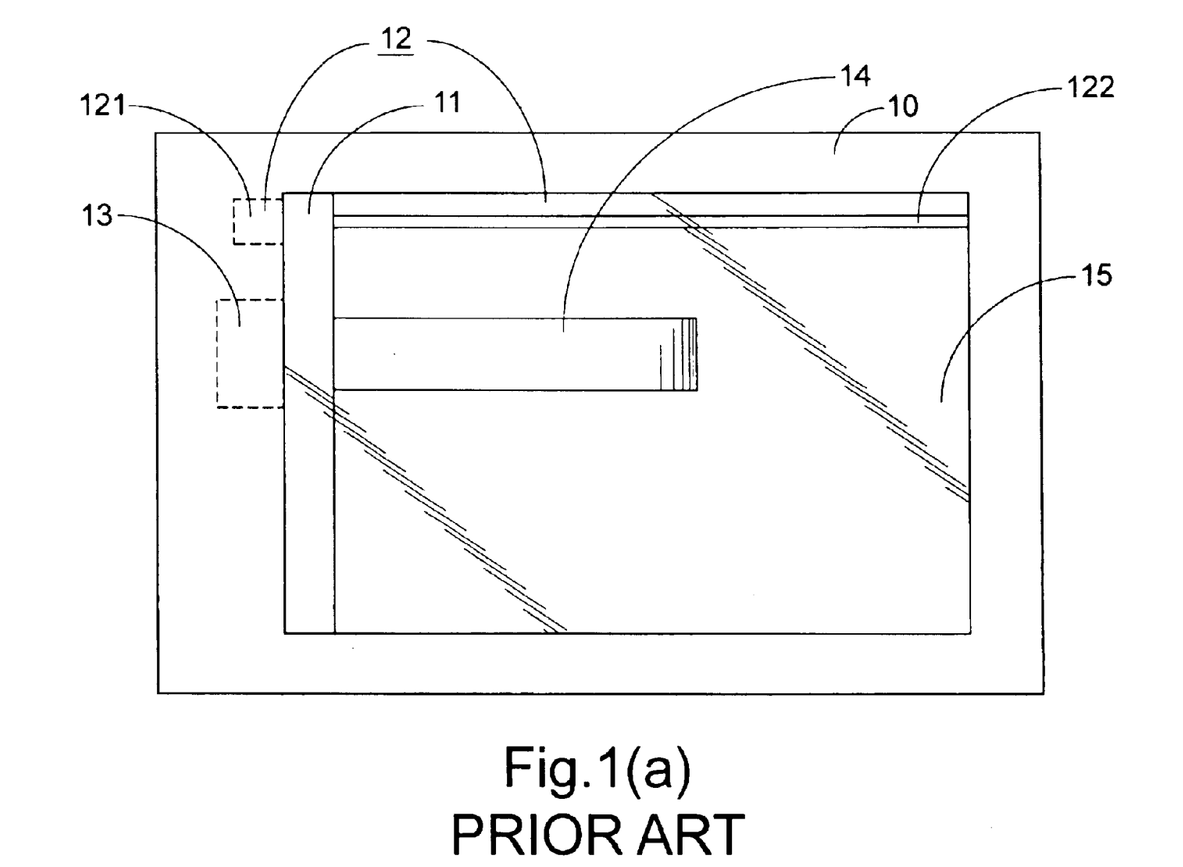
FIG. 1(a) is a schematic top plane view of a typical flatbed scanner.
Figure 1B:
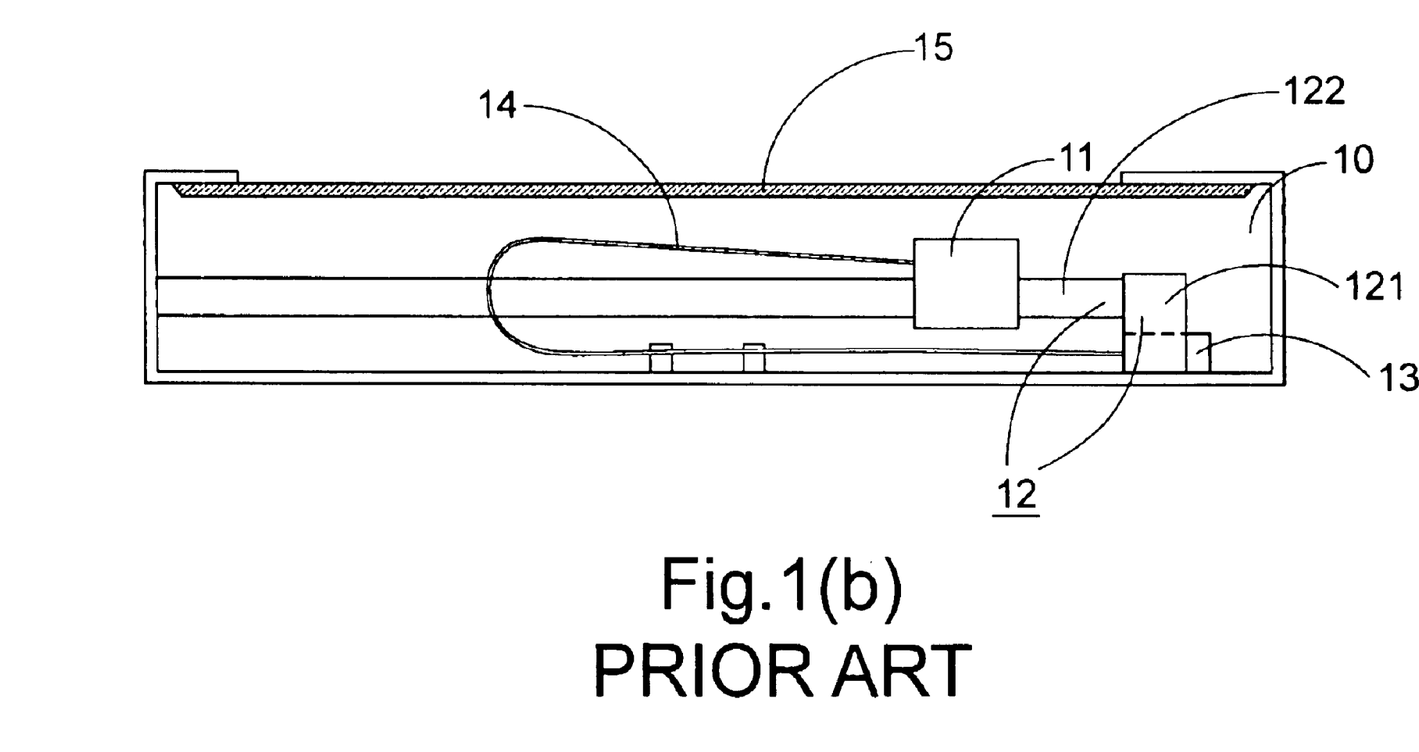
FIG. 1(b) is a schematic cross-sectional side view of the scanner of FIG. 1(a)

A flat flexible cable is a common connecting wire between electric devices. It is advantageous to be easily and reversibly bent and stretched in a narrow and crowded space. For example, in a flatbed image scanner, the moving-around carriage containing therein optical and photoelectric devices is connected with the circuit board through a flat flexible cable. Please refer to FIGS. 1(a) and 1(b) which are a top and a cross-sectional side views, respectively, schematically showing the arrangement of a flat flexible cable in a flatbed image scanner. The flatbed scanner includes an upper cover (not shown) and a lower housing 10. In the lower housing, a carriage 11 containing therein optical and photoelectric devices, a driving device 12 consisting of a motor and gear set 121 and a rail set 122, a circuit board 13 for processing electric signals received from the carriage 11, and a flat flexible cable 14 connecting the carriage 11 with the circuit board 13 are covered with a transparent scanning platform 15 for placing thereon the object to be scanned. The carriage 11 is moved by the motor and gear set 121 along the rail set 122 to pass by the scanned object, e.g. a document, film or picture, so as to realize the image data of the document or picture.

Figure 2A:
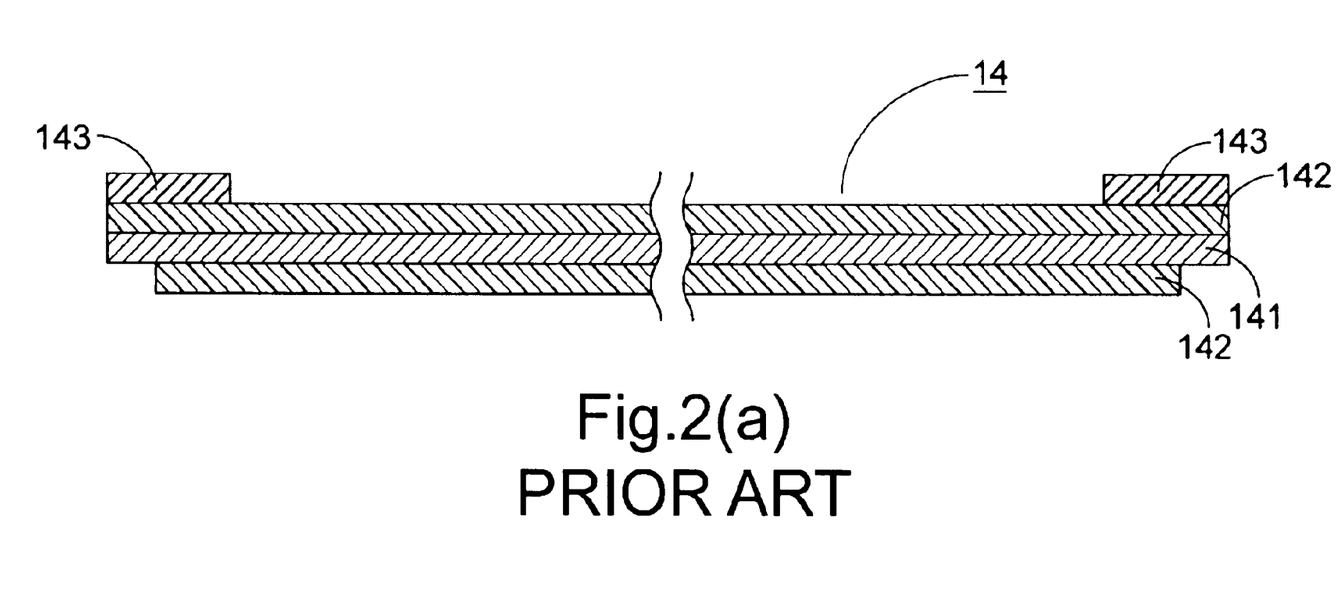
FIG. 2(a) is a schematic cross-sectional view showing the structure of a conventional flat flexible cable.

Please refer to FIG. 2(a), which is a schematic cross-sectional diagram showing the structure of a conventional flat flexible cable. The flat flexible cable 14 includes a flexible copper foil 141, an insulating wrapper 142 made of a flexible plastic, and a strengthening plate 143 made of a rigid plastic. The insulating wrapper 142 surrounds the copper foil 141 with two ends of the copper foil 141 exposed for electric contact with the carriage 11 and the circuit board 13, respectively. The strengthening plate 143 is mounted onto the end portion of the flat flexible cable 14 to facilitate the insertion of the exposed copper foil into the connecting slot (not shown) of the carriage 11 or the circuit board 13.

Figure 2B:
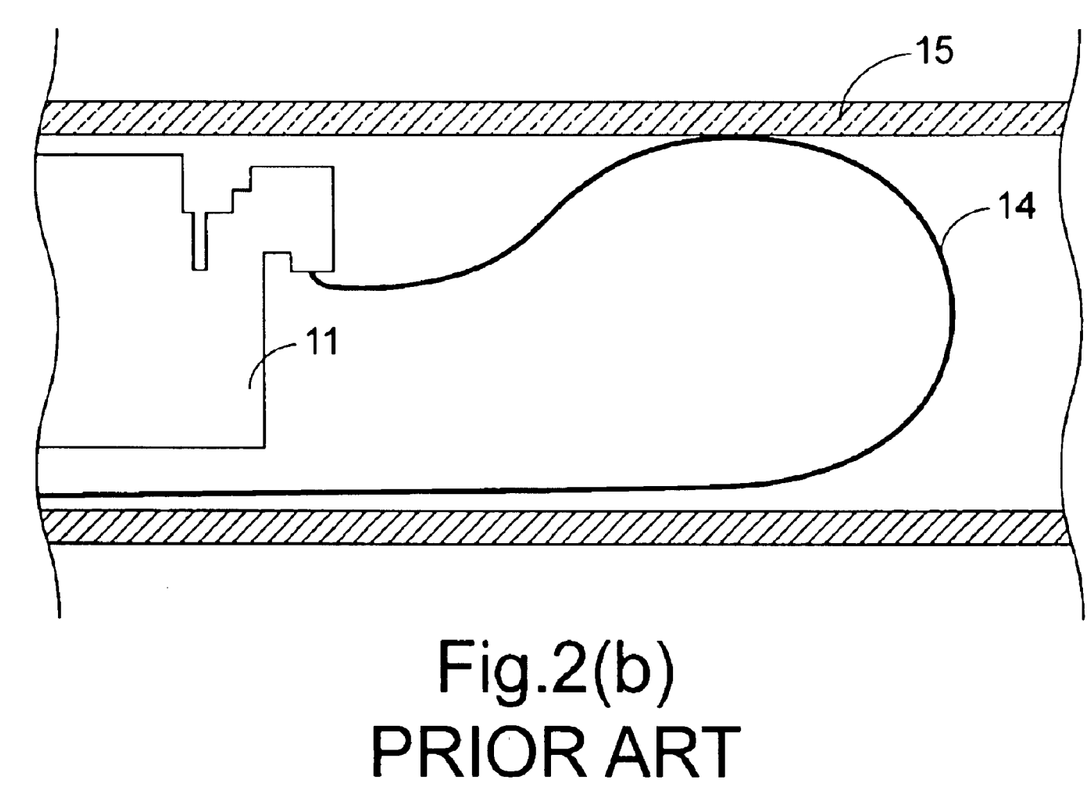
FIG. 2(b) is a schematic view illustrating the contact of the conventional flat flexible cable with the scanning platform of a scanner.

The configuration of the flat flexible cable 14 changes with the movement of the carriage 11 along a scanning direction. Before a scanning operation begins, the carriage 11 stands beside the circuit board 13 so that the flat flexible cable 14 is bent at around the middle point thereof. With the movement of the carriage 11 away from the circuit board 13, the bent point also advances. As is known to those skilled in the art, the flat flexible cable is made of light and flexible material such as plastic or rubber so that the bent portion ascends relative to the unbent portion due to the flexible property thereof. The bent portion may undesirably rise up to the inner surface of the platform 15 that is made of glass so as to be subject to abrasion. As shown in FIG. 2(b), abrasion is likely to occur in the bent portion due to the contact of the flat flexible cable 14 with the transparent platform 15. Especially for an image scanner having reduced thickness or using a contact image sensor (CIS) as an image pickup device which requires close contact with the document placed on the platform 15, the flat flexible cable 14 has great chance to keep in contact with the inner surface of the platform 15. The dropped chips resulting from the abrasion may smear the platform 15 and adversely affect the scanning quality.

SUMMARY OF THE INVENTION

The present invention provides an anti-abrasive device for isolating the flat flexible cable from the glass platform so as to avoid abrasion.

In accordance with a first aspect of the present invention, there is provided a mechanism for confining a flat flexible cable of an image scanner in position. The flat flexible cable is electrically connected between a circuit board and a carriage and bends differentially with the movement of the carriage relative to the circuit board under a scanning platform. The mechanism comprises a confining member disposed between a first portion of the flat flexible cable and the scanning platform for isolating the flat flexible cable from the scanning platform. The confining member changes states and bends differentially with the movement of the carriage relative to the circuit board under the scanning platform, and has a bending resistance greater than that of the flat flexible cable. Accordingly, the confining member is kept at least a certain clearance from the scanning platform while confining the first portion of the flat flexible cable thereunder.

In an embodiment, the confining member has one end secured to the carriage and disposed above the first portion of the flat flexible cable, and the other end secured to the circuit board. Preferably, the length of the confining member is slightly less than or equal to that of the flat flexible cable.

In an embodiment, the confining member has one end secured to the carriage and the other end secured to the circuit board and disposed above the first portion of the flat flexible cable.

Preferably, the confining member is unidirectionally bendable.

In an embodiment, the confining member comprises a flexible strip and a plurality of rigid ribs. The flexible strip bends differentially with the movement of the carriage. The plurality of rigid ribs are fixed on the flexible strip in close to each another for enhancing the bending resistance of the flexible strip.

In an embodiment, the flexible strip is made of a plastic material, and the rigid ribs are made of plastic or metals and arranged one by one in parallel along the moving direction of the carriage.

In an embodiment, the confining member comprises a plurality of rigid parts connected in series along the moving direction of the carriage, and each of the rigid parts is pivotally coupled to a preceding rigid part with the front-bottom corner and a following rigid part with the rear-bottom corner.

In accordance with a second aspect of the present invention, there is provided a mechanism for confining a flat flexible cable of an image scanner in position. The flat flexible cable is electrically connected between the circuit board and the carriage and bends differentially with the movement of the carriage relative to the circuit board under a scanning platform. The mechanism comprises a confining member disposed between the flat flexible cable and the scanning platform for isolating the flat flexible cable from the scanning platform. The confining member changes states with the movement of the carriage and continually tensed to keep itself at least a certain clearance from the scanning platform while confining the flat flexible cable thereunder.

In an embodiment, the confining member is a thread, rope or strip.

In an embodiment, the mechanism further comprises a pulley. The confining member has a first end connected to the carriage and a second end connected to the pulley, and is continually tensed by being rolled up by and released from the pulley with the movement of the carriage.

Preferably, the pulley is the one that is wound by the transmission belt for transmitting the carriage to move.

In an embodiment, the mechanism further comprises a reel for winding thereon the confining member before the confining member is connected to the pulley. The reel is disposed at a specific position to keep a first section of the confining member above the flat flexible cable to isolate the flat flexible cable from the scanning platform and a second section of the confining member connected to the pulley.

Preferably, the first section extends along the moving direction of the carriage, and the second section is substantially perpendicular to the first section.

In an embodiment, the confining member is made cyclic and has two ends thereof respectively secured to forward and rearward sides of the carriage and enclosing the flat flexible cable therewith.

In an embodiment, the mechanism further comprises two rollers disposed adjacent to and distant from the circuit board, respectively, along the moving direction of the carriage for tensing the confining member and facilitating the rotation of the confining member with the movement of the carriage.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

In order to avoid abrasion by isolating the flat flexible cable from the scanning platform in an image scanner, an anti-abrasive mechanism is used to confine the flat flexible cable in position under the scanning platform. According to the present invention, three kinds of anti-abrasive mechanism are exemplified as shown in FIGS. 3, 7 and 8, a whole or partial portion of which is disposed between the scanning platform and the flat flexible cable to avoid abrasion by suppressing or confining the flat flexible cable.

Figure 3A:
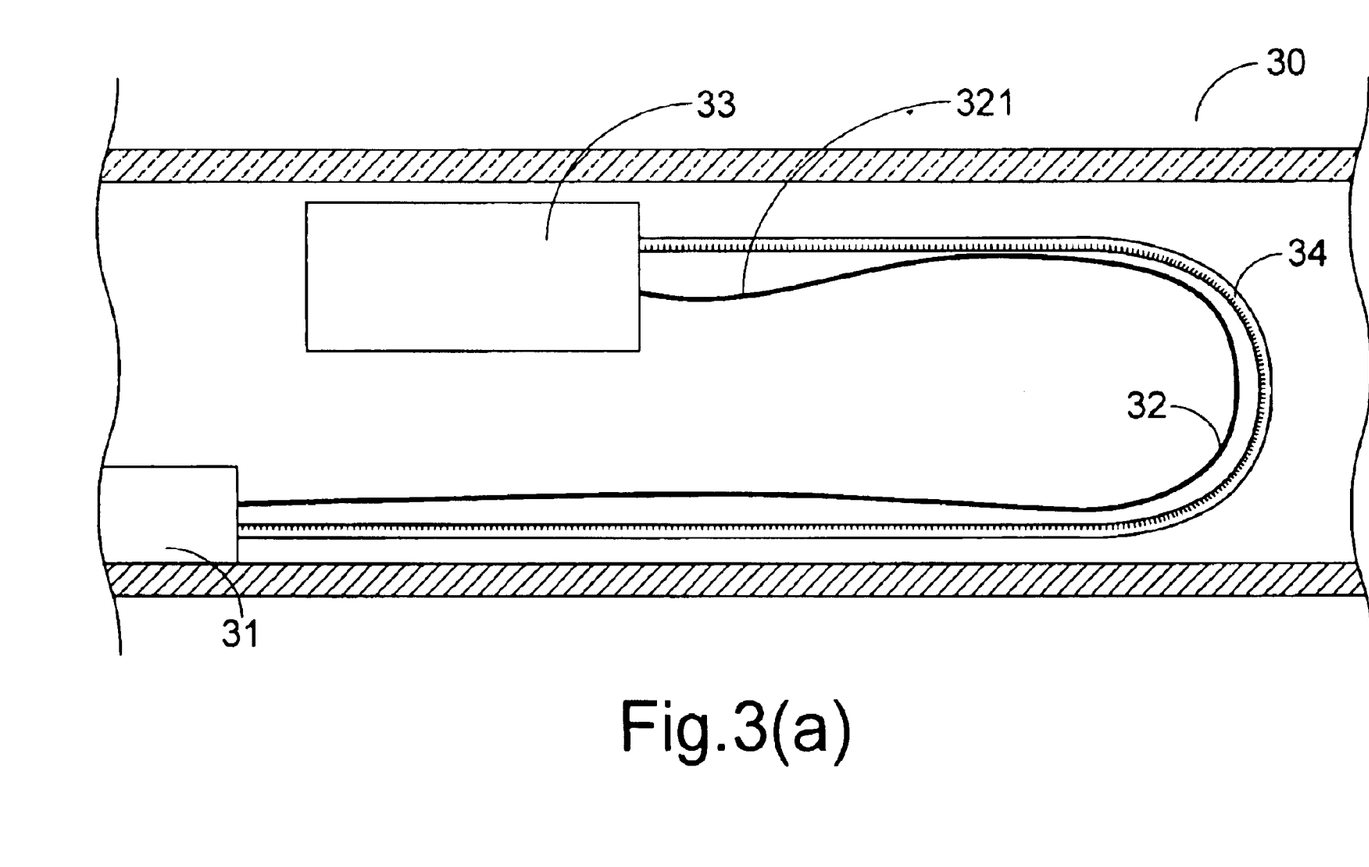
FIG. 3(a) schematically illustrates an anti-abrasive mechanism for confining a flat flexible cable of an image scanner in position according to a preferred embodiment of the present invention.
Figure 3B:
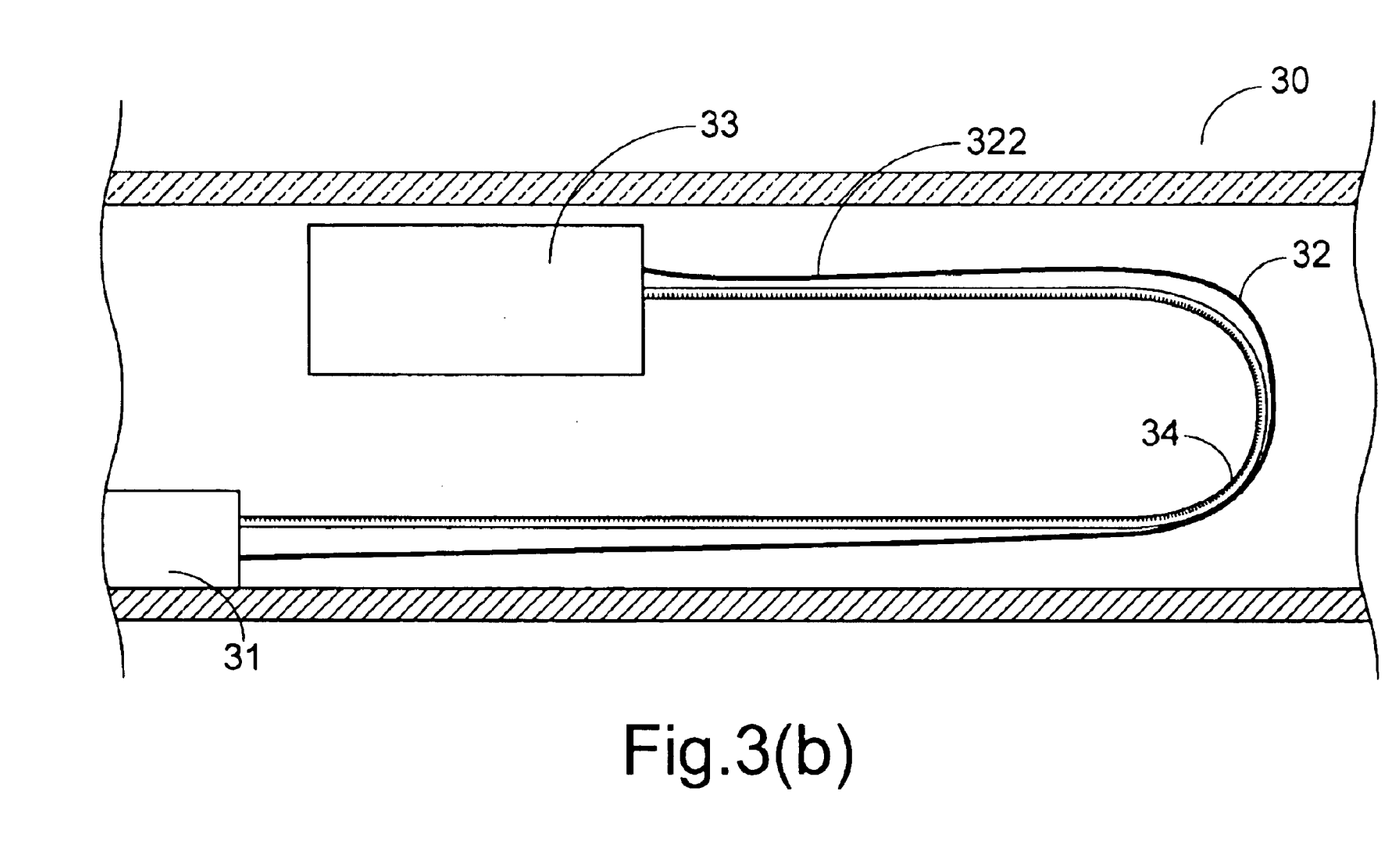
FIG. 3(b) schematically illustrates an anti-abrasive mechanism for confining a flat flexible cable of an image scanner in position according to another preferred embodiment of the present invention.

Referring to FIG. 3(a) or 3(b), an anti-abrasive mechanism for confining a flat flexible cable of an image scanner in position according to a preferred embodiment of the present invention is shown. When an object such as a document, picture or film is to be scanned by the image scanner, the object is placed on the scanning platform 30. The carriage 33 containing therein optical and photoelectric devices (not shown) passes through under the scanning platform 30 to pick up image of the scanned object. The flat flexible cable 32 connects the carriage 33 with the circuit board 31 to transmit electric signals generated by the photoelectric device in response to the picked image to the circuit board 31 to be further processed. With the movement of the carriage 33 relative to the circuit board 31 under the scanning platform 30, the flat flexible cable 32 bends differentially. As previously described, before a scanning operation begins, the carriage 33 stands beside the circuit board 31 so that the flat flexible cable 32 is bent at around the middle point thereof. With the movement of the carriage 33 away from the circuit board 31, the bent point also advances. In order to avoid the contact of the flat flexible cable 32 with the scanning platform 30, the flat flexible cable 32 should be confined in position.

In the embodiment shown in FIG. 3(a), the mechanism for confining the flat flexible cable 32 in position includes a confining member 34 disposed under the scanning platform 30 and enclosing the flat flexible cable 32. Thus, the upper portion 321 of the flat flexible cable 32, i.e. the end secured to the carriage 33, is suppressed by the confining member 34 to avoid rising up to the scanning platform 30. With the movement of the carriage 33 relative to the circuit board 31 under the scanning platform 30, the confining member 34 changes states and bends differentially. In order to achieve this purpose, it is preferred that the confining member 34 has a particular property or structure so that the confining member 34 itself is kept at least a certain clearance from the scanning platform 30 while confining the flat flexible cable 32 thereunder. For example, the confining member 34 is made unidirectionally bendable. That is, the confining member 34 can only be bent inward, i.e. toward the flat flexible cable 32, other than outwards, i.e. opposite the flat flexible cable 32. Moreover, it is preferred that the confining member 34 has a bending resistance greater than that of the flat flexible cable 32, thereby further assuring of the certain clearance from the scanning platform 30 without being pushed up to the scanning platform 30 by the flat flexible cable 32 thereunder. Advantageously, the length of the confining member 34 is no greater than, i.e. equal to or slightly less than, that of the flat flexible cable 32 for better confining effect. More preferably, the flat flexible cable 32 is only partially in contact with the confining member 34 to avoid abrasion therebetween.

The confining member 34 in the above embodiment confines the flat flexible cable 32 by suppressing the upper portion 321 of the flat flexible cable 32. Alternatively, the confining member 34 can be enclosed with the flat flexible cable 32, as is shown in FIG. 3(b) so that the lower portion 322 of the flat flexible cable 32 is suppressed by the confining member 34. Since the lower portion 322 of the flat flexible cable 32 is pulled downwards, the purpose of preventing the bent portion of the flat flexible cable 32 from rising up to the scanning platform 30 can also be achieved.

Figure 4A:
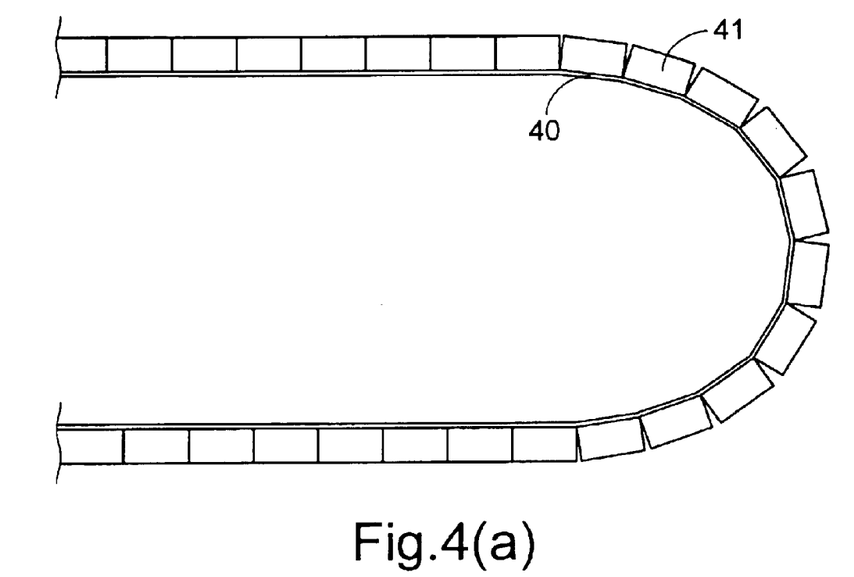
FIGS. 4(a)~(g) schematically illustrate a first embodiment of the confining member used in the anti-abrasive mechanism of FIG. 3(a) or 3(b) and exemplified variations thereof.
Figure 4B:
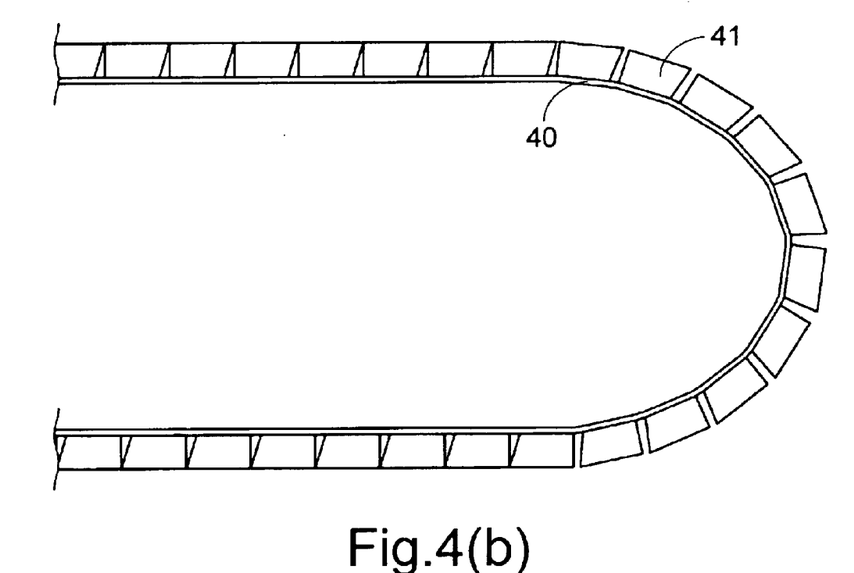
Figure 4C:
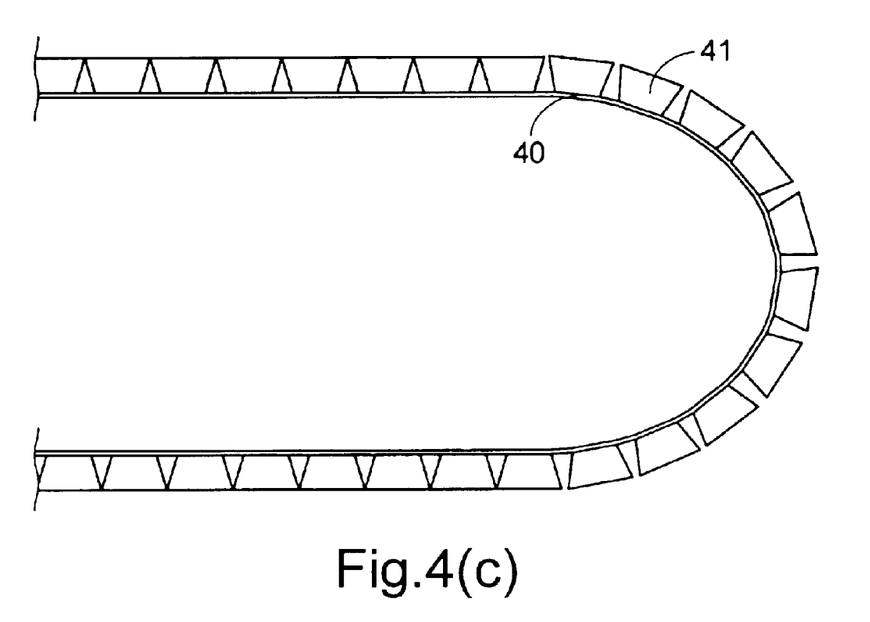
Figure 4D:
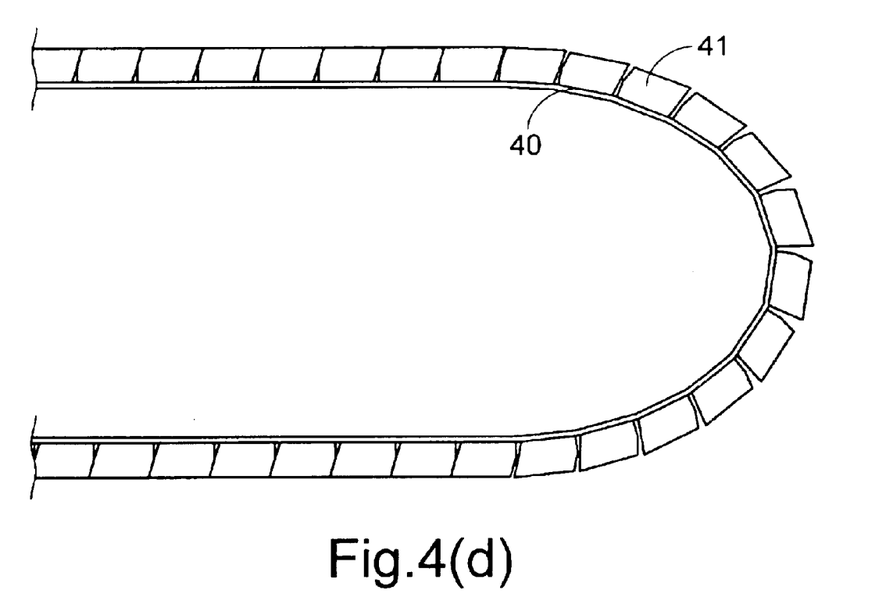
Figure 4E:
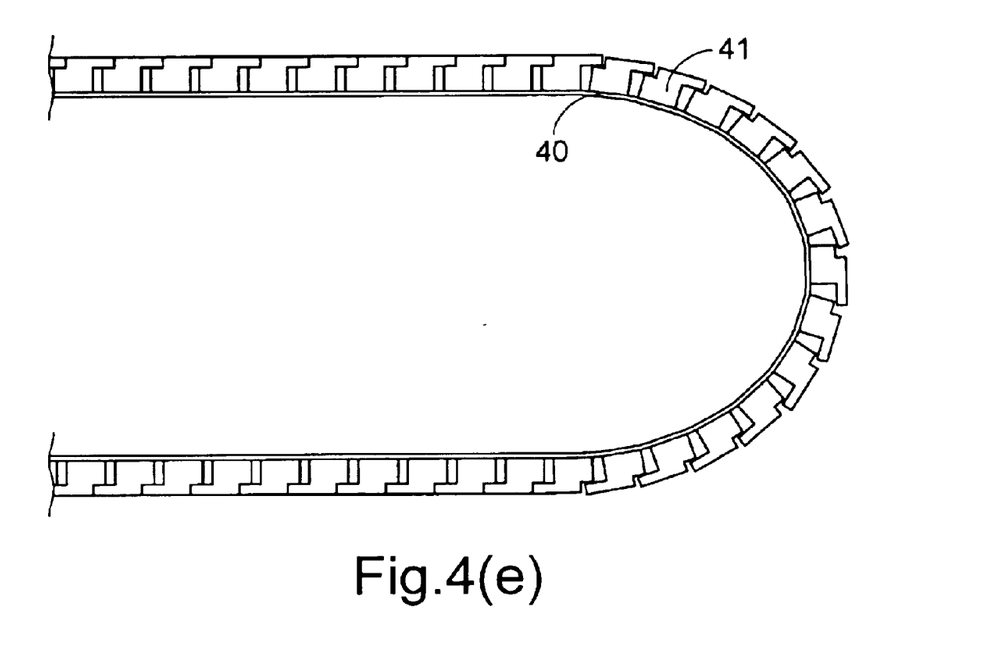
Figure 4F:
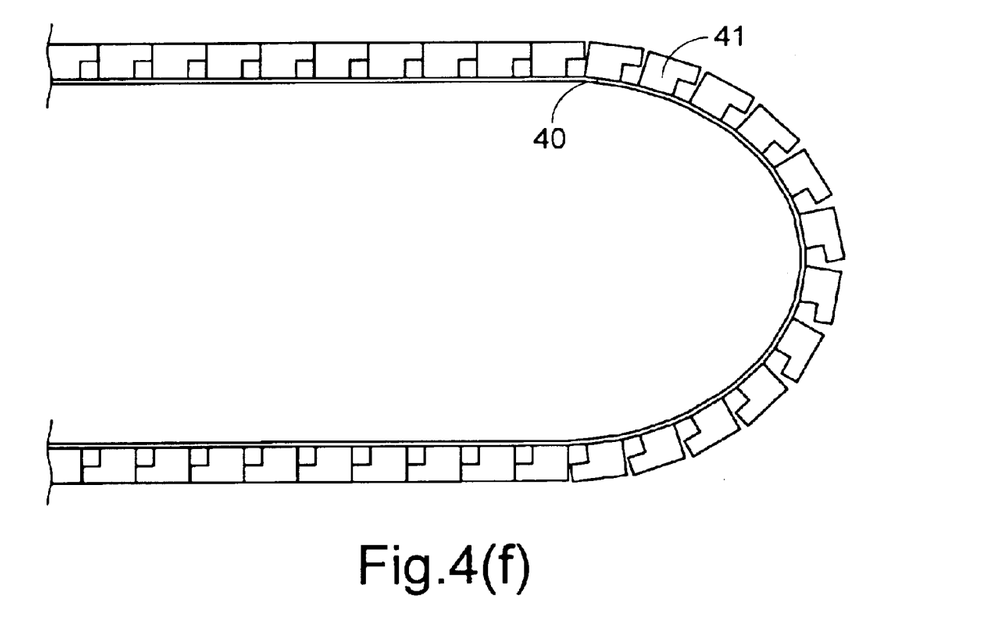
Figure 4G:
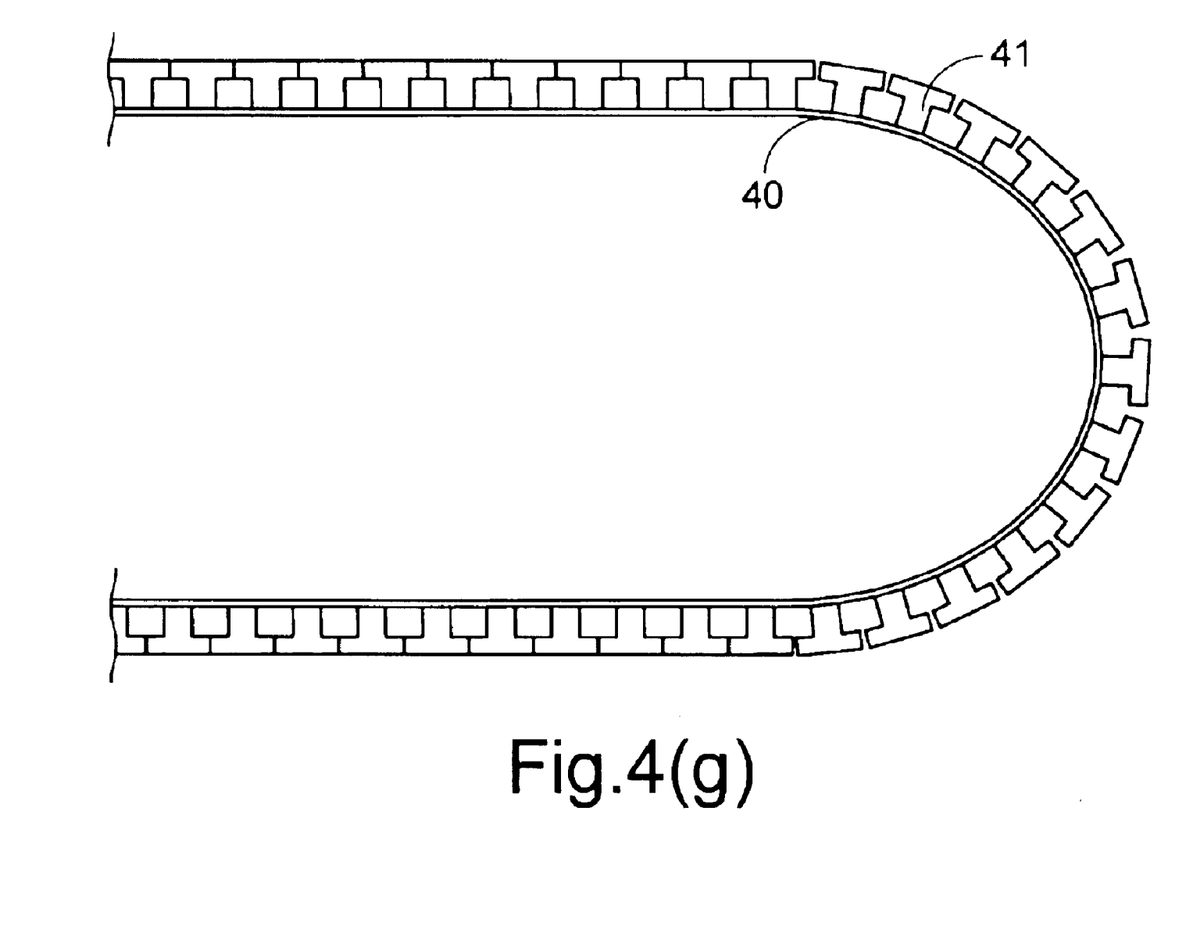

Referring to FIG. 4(a), an example of the confining member is shown. The confining member comprises a flexible strip 40 and a plurality of rigid ribs 41. The flexible strip 40 can be, for example, a plastic film. The rigid ribs 41 are fixed on the flexible strip 40 and arranged one by one in parallel in close to one another along the moving direction of the carriage so as to enhance the bending resistance of the flexible strip 40. The rigid ribs can be made of plastic or metals. In FIG. 4(a), the cross section of each single rigid rib 41 has a cross section of a rectangular shape. Alternatively, the cross section of the rigid rib 41 can be trapezoid-, pentagon-, Z-letter-, L-letter-, T-letter-shaped, as shown in FIGS. 4(b) to 4(g), respectively, or any other suitable shape facilitating the differential bending of the confining member.

Figure 5A:
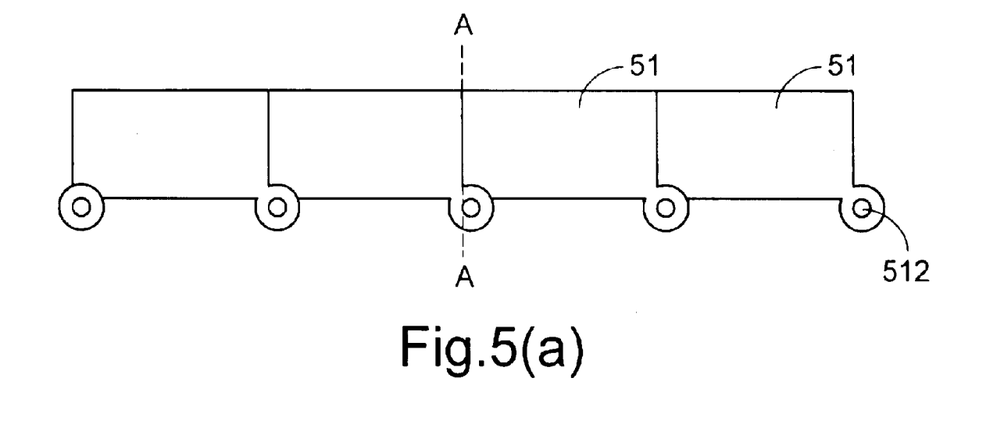
FIGS. 5(a) and 5(b) are respectively a side and a cross-sectional views showing a second embodiment of the confining member used in the anti-abrasive mechanism of FIG. 3(a) or 3(b)
Figure 5B:
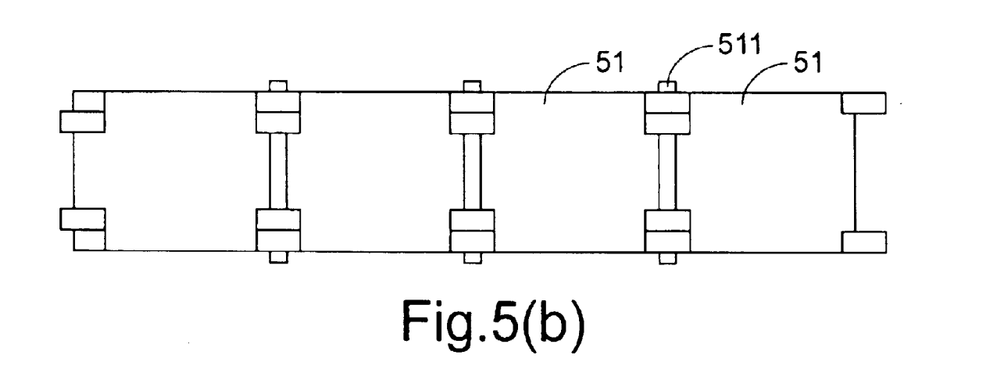

The rigid parts 41, instead of being combined together by the flexible trip 40 as shown in FIGS. 4(a)~4(g), can also be interconnected in a manner as illustrated in FIGS. 5(a) and 5(b), wherein FIG. 5(b) is a cross-sectional view taken along the A—A line of FIG. 5(a). In this embodiment, the confining member comprises a plurality of rigid parts 51 connected in series along the moving direction of the carriage. By inserting a pin 511 into an opening 512 at the right bottom corner of each rigid part 51, each rigid part 51 is pivotally coupled to a preceding rigid part with the front-bottom corner and a following rigid part with the rear-bottom corner. Accordingly, the confining member can bend differentially with the movement of the carriage.

Figure 6:
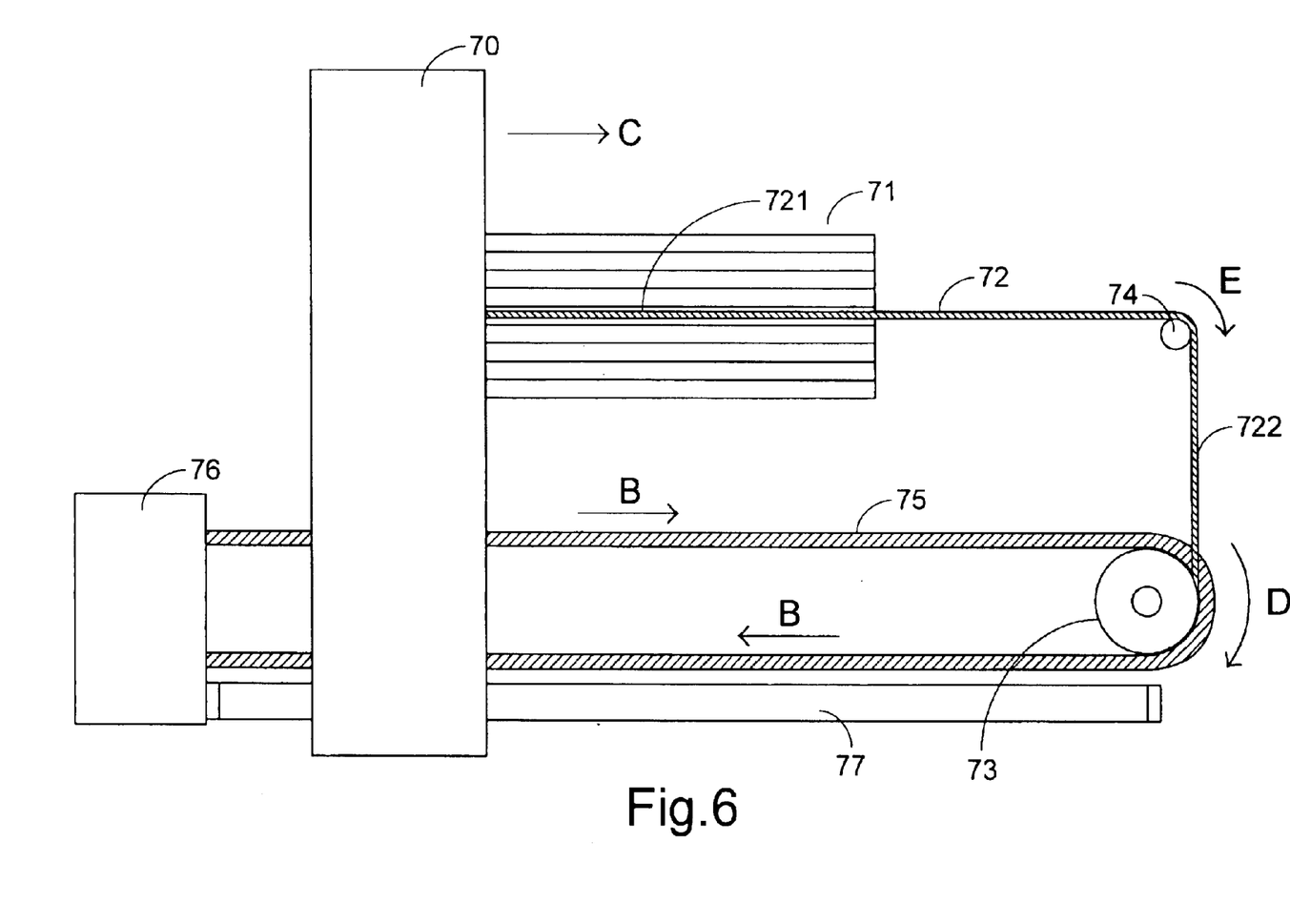
FIG. 6 is a top view schematically illustrating an anti-abrasive mechanism for confining a flat flexible cable of an image scanner in position according to another preferred embodiment of the present invention.
Figure 7:
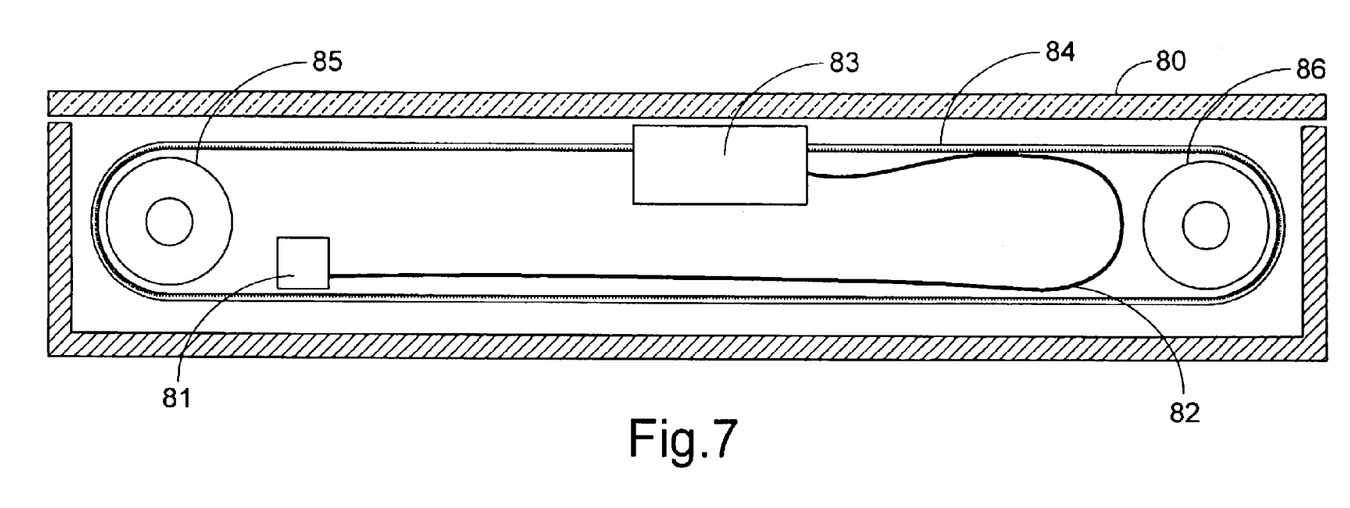
FIG. 7 is a cross-sectional side view schematically illustrating an anti-abrasive mechanism for confining a flat flexible cable of an image scanner in position according to a further preferred embodiment of the present invention.

Referring to FIG. 6, another embodiment of the anti-abrasive mechanism for confining a flat flexible cable of an image scanner in position is shown. The anti-abrasive mechanism for confining the flat flexible cable 71 in position includes a confining member 72, a pulley 73 and a reel 74. In this embodiment, the pulley 73 is the one winding thereon the transmission belt 75 for transmitting carriage to move along the guiding rail 77. The confining member 72 can be, for example, a thread, rope or strip that has one end secured to the carriage 70 above the flat flexible cable 71 and the other end secured and wound onto the pulley 73. The intermediate portion of the confining member 72 is further wound onto the reel 74, which is disposed at a specific position such that a first section 721 of the confining member 72 extends along the moving direction of the carriage 70, and the second section 722 of the confining member 72 is substantially perpendicular to the first section 721.

The confining member 72 is continually tensed to keep itself at least a certain clearance from the scanning platform, and thus able to confine the flat flexible cable 71 thereunder all the time. When a motor 76 drives the transmission belt 75 to move in a direction B, the carriage 70 will move along the direction C. Meanwhile, the pulley 73 and the reel 74 rotate clockwise (in a direction as indicated by the arrows D and E, respectively) so as to roll the confining member 72 up, thereby keeping the tensing state of the confining member 72. On the other hand, when the carriage 70 is moving backward the standby position, the confining member 72 is loosened from the pulley 73 with the movement of the carriage 70 due to the counterclockwise rotation of the pulley 73 and reel 74 transmitted by the transmission belt 75.

Referring to FIG. 7, a further embodiment of the mechanism for confining a flat flexible cable of an image scanner in position is shown. The anti-abrasive mechanism for confining the flat flexible cable 82 in position includes a confining member 84, a first roller 85 and a second roller 86. The confining member 84 can be, for example, a thread, rope or strip. The first roller 85 and the second roller 86 are disposed adjacent to and distant from the circuit board 81, respectively. The confining member 84 is made cyclic and has two ends thereof respectively secured to forward and rearward sides of the carriage 83 and enclosing the flat flexible cable 82 therewith. Preferably, the confining member 84 is kept tensed while the carriage 83 is moving so as to isolate the flat flexible cable 82 from the scanning platform 80.

From the above description, by providing an anti-abrasive mechanism of the present invention in the image scanner, the flat flexible cable is capable of being confined in position due to the specifically designed configuration or continuously tensing feature of the confining member. By isolating the flat flexible cable isfrom the glass platform, the abrasion problem can be effectively solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A mechanism for confining a flat flexible cable of an image scanner in position, said flat flexible cable being electrically connected between a circuit board and a carriage and bending differentially with the movement of said carriage relative to said circuit board under a scanning platform, said mechanism comprising a separate confining member disposed between a first portion of said flat flexible cable and said scanning platform for isolating said flat flexible cable from said scanning platform, wherein said confining member changes states and bends differentially with the movement of said carriage relative to said circuit board under said scanning platform, and has a bending resistance greater than that of said flat flexible cable so as to keep itself at least a certain clearance from said scanning platform while confining said first portion of said flat flexible cable thereunder; wherein said confining member comprises; a flexible strip which bends differentially with the movement of said carriage; and a plurality of rigid ribs fixed on said flexible strip close to each other for enhancing the bending resistance of said flexible strip.

2. The mechanism according to claim 1 wherein said confining member has one end secured to said carriage and disposed above said first portion of said flat flexible cable, and the other end secured to said circuit board.

3. The mechanism according to claim 2 wherein the length of said confining member is no greater than that of said flat flexible cable.

4. The mechanism according to claim 1 wherein said confining member has one end secured to said carriage and the other end secured to said circuit board and disposed above said first portion of said flat flexible cable.

5. The mechanism according to claim 1 wherein said confining member is unidirectionally bendable.

6. The mechanism according to claim 6 wherein said flexible strip is made of a plastic material, and said rigid ribs are made of plastic or metals and arranged one by one in parallel along the moving direction of said carriage.

* * * * *

UNITED STATES PATENT AND TRADEMARK OFFICE
CERTIFICATE OF CORRECTION

PATENT NO.         : 6,953,898 B2                                              Page 1 of 1
APPLICATION NO. : 10/791135
DATED              : October 11, 2005
INVENTOR(S)        : Chen et al.

It is certified that error appears in the above-identified patent and that said Letters Patent is hereby corrected as shown below:

Column 6
Line 44, change "comprises;" to --comprises:--
Line 62, change "claim 6" to --claim 1--

Signed and Sealed this

Ninth Day of November, 2010

David J. Kappos
*Director of the United States Patent and Trademark Office*